(12) United States Patent
Burl et al.

(10) Patent No.: US 6,850,067 B1
(45) Date of Patent: Feb. 1, 2005

(54) TRANSMIT MODE COIL DETUNING FOR MRI SYSTEMS

(75) Inventors: Michael Burl, Chagrin Falls, OH (US); Mark Xueming Zou, Aurora, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/440,834

(22) Filed: May 19, 2003

Related U.S. Application Data

(60) Provisional application No. 60/381,139, filed on May 17, 2002.

(51) Int. Cl.[7] ............................................... G01V 3/00
(52) U.S. Cl. ..................................... 324/322; 324/318
(58) Field of Search ............................. 324/322, 318, 324/314, 306, 307, 309, 300

(56) References Cited

U.S. PATENT DOCUMENTS

| 4,620,155 A | 10/1986 | Edelstein |
| 4,788,503 A | * 11/1988 | Van Heelsbergen ......... 324/322 |
| 4,825,162 A | 4/1989 | Roemer et al. |
| 5,317,266 A | * 5/1994 | Meissner .................... 324/318 |
| 5,477,146 A | * 12/1995 | Jones ......................... 324/318 |

* cited by examiner

*Primary Examiner*—Louis Arana
(74) *Attorney, Agent, or Firm*—Michael A. Della Penna; Armstrong Teasdale LLP

(57) ABSTRACT

A detuning circuit for an MRI coil having a series tuning capacitor includes: a detuning inductor and a PIN diode in parallel communication with the tuning capacitor, where the tuning capacitor has a tuning inductor node and a PIN diode node; a first diode and a second diode in parallel communication with the PIN diode, where the first, second and PIN diodes are arranged with the same serial polarity and the first and second diodes have a common node; and a reactance in communication between the common node and the tuning inductor node. The circuit detunes the MRI coil in response to an MRI transmit pulse. A detuning circuit for an MRI coil having a series tuning capacitor includes a detuning inductor; and a detuning switch in parallel combination with a secondary tuning capacitor, the detuning inductor and the parallel combination being in parallel communication with the series tuning capacitor. The secondary tuning capacitor acts to reduce current during detuning of the MRI coil.

20 Claims, 5 Drawing Sheets

TRANSMIT MODE COIL DETUNING FOR MRI SYSTEMS

CROSS-REFERENCE TO RELATED APPLICATION

This application claims the benefit of U.S. provisional patent application Ser. No. 60/381,139 filed May 17, 2002.

BACKGROUND OF THE INVENTION

The present invention relates to magnetic resonance imaging systems, and particularly to the radio frequency coils used in such systems.

Magnetic resonance imaging (MRI) utilizes hydrogen nuclear spins of the water molecules in the human body, which are polarized by a strong, uniform, static magnetic field of the magnet (named $B_0$—the main magnetic field in MRI physics). The magnetically polarized nuclear spins generate magnetic moments in the human body. The magnetic moments are aligned parallel to the direction of the main magnetic field, $B_0$, in a steady state, and produce no useful information if they are not disturbed by any excitation.

The generation of a nuclear magnetic resonance signal (NMR) for MRI data acquisition is accomplished by applying a uniform radio frequency (RF) magnetic field (named the $B_1$ field or the excitation field) orthogonal to $B_0$. This RF field is centered on the Larmor frequency of protons in the $B_0$ field and causes the magnet moments to mutate their alignment away from $B_0$ by some predetermined angle. The $B_1$ field is produced in the imaging region of interest by an RF transmit coil which is driven by a computer-controlled RF source and an RF power amplifier. During excitation, the nuclear spin system absorbs magnetic energy, and the magnetic moments precess around the direction of the main magnetic field. After excitation, the precessing magnetic moments will go through a process of free induction decay, releasing their absorbed energy and returning to the steady state. During free induction decay, NMR signals are detected by the use of a receive RF coil, which is placed in the vicinity of the excited volume of the human body. The NMR signal is the secondary electrical voltage (or current) in the receive RF coil that has been induced by the precessing magnetic moments of the excited protons in the human tissue. The receive RF coil can be either the transmit coil itself, or an independent receive-only RF coil. The NMR signal is used for producing images by using additional pulsed magnetic gradient fields, which are generated by gradient coils integrated inside the main magnet system. The gradient fields are used to spatially encode the signals and selectively excite a specific volume of the human body. There are usually three sets of gradient coils in a standard MRI system, which generate magnetic fields in the direction of the main magnetic field, varying linearly in the imaging volume.

In MRI, it is desirable for the excitation and reception to be spatially uniform in the imaging volume for better image uniformity. In a standard MRI system, the best excitation field homogeneity is usually obtained by using a whole-body volume RF coil for transmission. The whole-body transmit coil is the largest RF coil in the system. A large coil, however, produces lower signal-to-noise ratio (SNR or S/N) if it is also used for reception, mainly because of its greater distance from the signal-generating tissues being imaged. Since a high signal-to-noise ratio is most desirable in MRI, special-purpose receive coils are used for reception to enhance the S/N ratio from the volume of interest.

In practice, a well-designed specialty RF coil should have the following functional properties: high S/N ratio, good uniformity, high unloaded quality factor (Q) of the resonance circuit, and high ratio of the unloaded to loaded Q factors. In addition, the coil device should be mechanically designed to facilitate patient handling and comfort, and to provide a protective barrier between the patient and the RF electronics. A further way to increase the SNR is to replace the single specialty coil with an array of smaller coils and through the use of multiple receivers, add the signals together at the image construction stage. It is desirable to have a large RF transmit coil to create a uniform $B_1$ field and to minimize as far as possible any distortion of the transmit field due to the presence of a receive coil. Of course the receive coil is also tuned to the Larmor frequency and without intervention this coil couples very strongly to the transmitter coil. It is almost universal practice to detune the receive coil during the transmit pulse by some means. A common method is to switch an inductor across one or more, of the numerous tuning capacitors that are included in the receive coil. This switching usually takes two forms: active and passive. Both are shown clearly by Edelstein in U.S. Pat. No. 4,620,155 and summarized in FIG. 1.

The active form uses a PIN diode pre-biased during transmit with a small dc current that forward biases the diode and creates sufficient stored charge in the junction so that it remains conducting during the whole cycle of a RF current waveform.

The passive alterative replaces the single PIN diode switch with a crossed pair of fast switching diodes. This crossed diode configuration avoids the need for dc bias because each half cycle of the current waveform is handled by one or other of the two diodes.

With active PIN diode coil detuning, the "on" resistance of the PIN diodes is very low and therefore the parallel resonant circuit formed by the coil tuning capacitor, the PIN diode and the detuning inductor has a high Q factor, and consequently high impedance. Active de-tuning has the disadvantage of the inconvenience and difficulty of feeding a dc current to all the diodes without either spoiling the RF characteristics of the receive coil, or distorting the $B_0$ field by fields created by the dc bias current.

With passive coil de-tuning, there are no dc bias wires to route. Passive de-tuning has two main disadvantages. Firstly, the coil is not de-tuned until there is enough RF induced voltage to cause the switching diodes to conduct. However, the induced voltage can be several hundred volts and so the passive deturing is quite effective. Also it is not uncommon to include one active de-tuning circuit so that the coils can be de-tuned even in receive mode and the coil does not distort very weak RF pulses. Secondly, the conduction losses are higher in fast switching diodes than for PIN diodes, this result in a lower parallel or "blocking" impedance compared with the active version. Add to this the switching losses in the diodes and considerable heat is created when used in the most power demanding situations.

SUMMARY OF THE INVENTION

Referring to FIG. 1, a MRI RF coil 10 includes tuning capacitors 12 connected between coil traces 14. Detuning inductors 16 are switched into parallel with the capacitors 12 during a transmit pulse. The tuning capacitors 12 and detuning inductors 16 in the coil 10 are made to form parallel resonant circuits of high impedance, for "blocking" current flow in the coil 10. The losses found in the passive decoupling circuit 18 not only creates heat during transmit but also reduces the "blocking" impedance compared with an ideal switch.

Referring to FIG. 2, the active PIN diode 20 (or other diode having sufficient stored charge) detuning circuit 22 remains conducting for a whole cycle of the RF waveform because the stored charge in the junction does not get depleted during the period of reverse current flow. This is normally achieved by a small dc current supplied in advance of the RF waveform. This of course requires the dc bias supply 24.

A detuning circuit for an MRI coil having a series tuning capacitor includes: a detuning inductor and a PIN diode in parallel communication with the tuning capacitor, where the tuning capacitor has a detuning inductor node and a PIN diode node; a first diode and a second diode in parallel communication with the PIN diode, where the first, second and PIN diodes are arranged with the same serial polarity and the first and second diodes have a common node; and a reactance in communication between the common node and the detuning inductor node. The circuit detunes the MRI coil in response to an MRI transmit pulse.

A detuning circuit for an MRI coil having a series tuning capacitor includes a detuning inductor; and a detuning switch in parallel combination with a secondary tuning capacitor, the detuning inductor and the parallel combination being in parallel communication with the series tuning capacitor. The secondary tuning capacitor acts to reduce current during detuning of the MRI coil.

DESCRIPTION OF THE PREFERRED EMBODIMENTS

Figure 3:
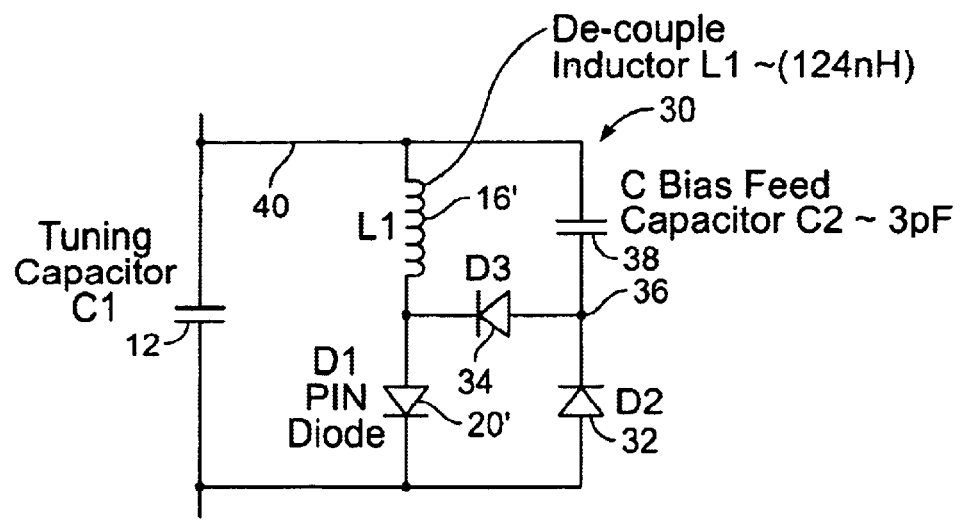
FIG. 3 is a schematic diagram of an auto-biased detuning circuit according to the invention.

Referring to FIG. 3, an auto-bias detuning circuit 30 includes a detuning inductor 16' and PIN diode 20' (or other suitably "slow" diode) in parallel with the tuning capacitor 12. Switching diodes 32, 34 (or other diodes that can switch at the RF frequency) are connected in parallel with the PIN diode 20'. The common node 36 of the diodes 32, 34 is connected through a bias capacitor 38 to the detuning inductor node 40 of the capacitor 12. The diodes 20', 32, 34 are arranged with the same polarity with respect to a serial path through the diodes 20', 32, 34.

In normal operation, the RF voltages and currents in the coil 10 are on the order of hundreds of volts and several amperes, so it is feasible to take a small fraction of the available power for conversion to DC to forward bias the PIN diode 20'. This small power drain is much smaller than the power turned into heat by the switching losses in a normal passive de-coupler. During the negative going RF cycle, current flows through the diode 32 and adds charge to the bias capacitor 38.

During the positive going RF cycle, current flows through the diode 34 into the PIN diode 20'. Because both halves of the cycle are used, only a small voltage (e.g., 1 volt) is used to operate the circuit and start building up charge in the PIN diode 20'.

As the RF voltage across the tuning capacitor 12 rises, more RF current flows through the de-tuning circuit 30 and hence more DC current is needed to keep the PIN diode 20' conducting. PIN diodes are normally selected to have a carrier lifetime on the order of 1 microsecond so that the controlling dc current needs only to be a few percent of the peak RF current. Current through the bias capacitor 38 also increases with the applied voltage and adds charge to the PIN diode 20' to maintain conduction.

In practice, the circuit 30 cannot start instantaneously because of the time needed to build up charge in the PIN diode 20. In practice, the rise time found in MRI scanners may be more than 10 microseconds and gating an RF power amplifier can create a rise time of 5 microseconds. A turn on effect is visible using a fast solid state amplifier and the voltage across the detuning switch appears to be higher than the normally conducting state for about 0.5 to 1.5 microseconds, this duration depends on the charge storage time of the PIN diode.

Figure 4:
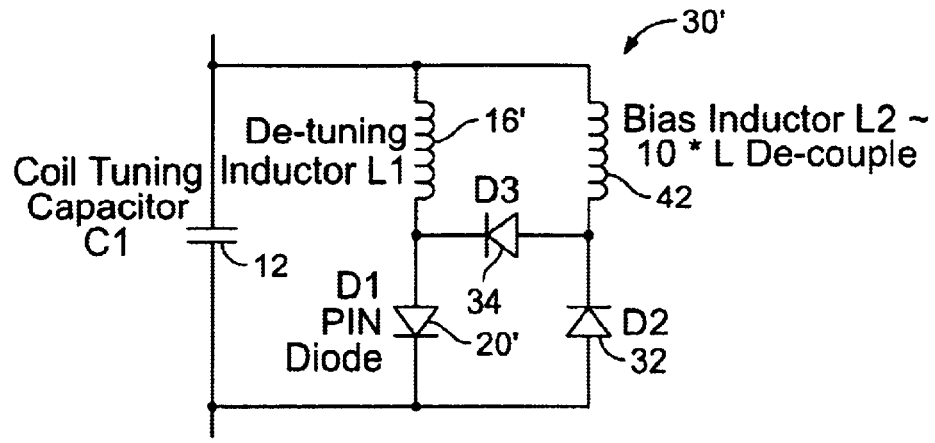
FIG. 4 is a schematic diagram of another auto-biased detuning circuit according to the invention.

Referring to FIG. 4, it can be seen that it is possible to use an inductive bias reactance 42 in the auto-bias circuit 30' instead of the capacitive auto-bias reactance (bias capacitor 38) of FIG. 3. In this case, the current through the bias inductor 42 is in phase with the detuning inductor 16'. The current through the passive branch (the inductor 42 and the diodes 32, 34) reduces the current through the PIN diode 20' when it is reverse biased but allows the full detuning current to flow through the diode 20' when it is forward biased. If the current through the inductor 42 is 10% of the current through the inductor 12, it creates, what amounts to, a 5% DC bias. Another way of looking at the operation of the circuit 30' is to say the charge that went into the diode 20' on the positive half wave is not completely swept out on the negative cycle and so the diode never leaves the conducting state. This inductor feed arrangement has an advantage over the capacitor feed in that the current through the inductor 42 contributes to the decoupling effectiveness of the inductor 16', whereas the current through the capacitor 38 in the circuit 30 needs to be detuned by the inductor 16', thereby increasing the de-tuning current slightly.

A further alternative is to use a high value of inductor in parallel with the capacitor 38 so that together they are equivalent to a capacitor or an inductor.

Figure 8:
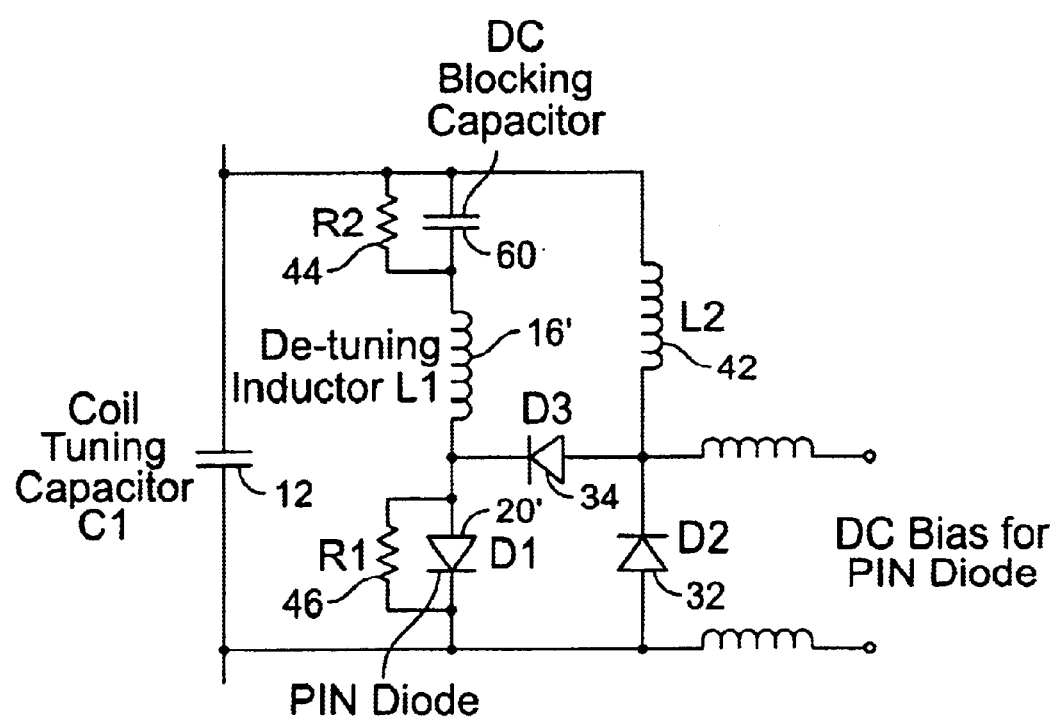
FIG. 8 is a schematic diagram of an additional detuning circuit according to the invention.

Referring to FIG. 8, for example, the auto-bias circuit can also be used for active detuning in transmit mode that will require less DC current compared with the prior art. This allows the circuit to be de-tuned in receive mode by a few milliamperes, not enough to distort $B_0$, and the auto bias circuit supplies the extra DC current during a transmit pulse. A DC blocking capacitor 60 is placed in series with the detuning inductor 16' allowing both the PIN diode 20' and switching diode 34 to be tuned on by the DC current.

It should be noted that the circuits described herein may have been simplified for ease of understanding the functioning and interrelationships of the components of interest. For example, referring further to FIG. 8, it is common practice to install high value resistors across diodes and capacitors to remove unwanted charge following the transmit pulse, these circuits are no different and resistors 44, 46 serve this function.

The auto-bias can also be added to the normal active PIN diode circuit, for example a T/R switch or active detuning circuit, as a form of protection against the fault condition that applies RF power in the absence of the correct PIN diode bias current.

Figure 5:
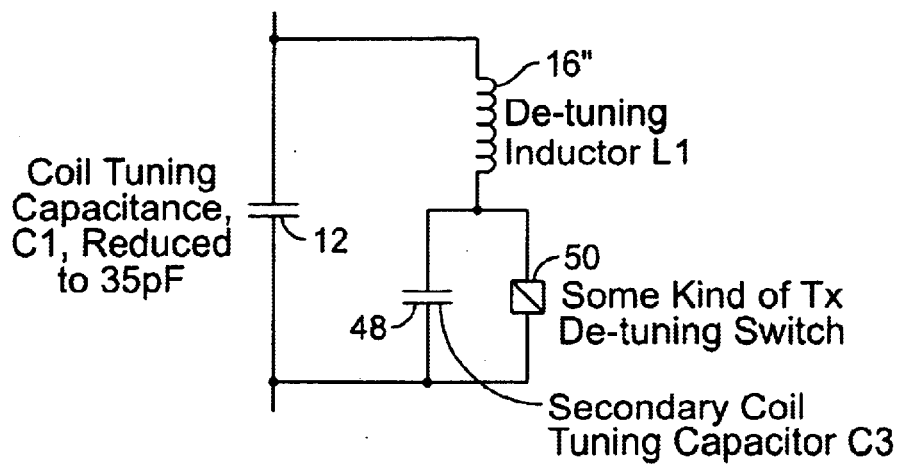
FIG. 5 is a schematic diagram of another detuning circuit according to the invention.

Referring to FIG. 5, it is possible to reduce circulating current in the detuning inductor. During the transmit pulse, the coil segments adjacent to the detuned capacitor become antennae in a very strong E-field and the detuning circuit has to cope with this induced voltage without over-heating. The current in the detuning circuit is given by dividing the induced Voltage by the reactance of the tuning capacitance. The current in the detuning circuit can be reduced by taking part of the tuning capacitor and moving it to the diode side of the detuning inductor.

Figure 1:
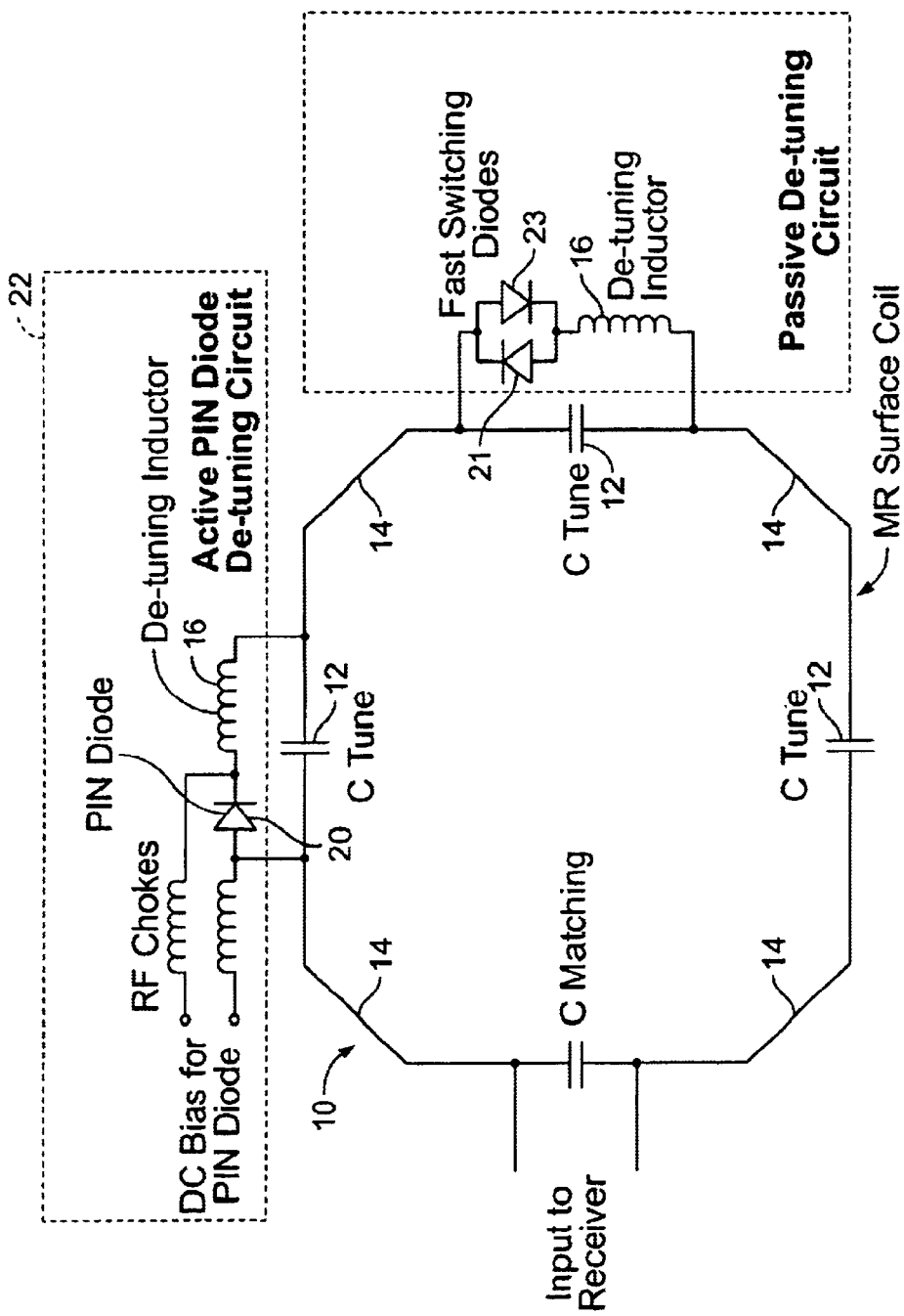
FIG. 1 is a schematic diagram of a prior art MRI coil with active and passive detuning circuits.
Figure 2:
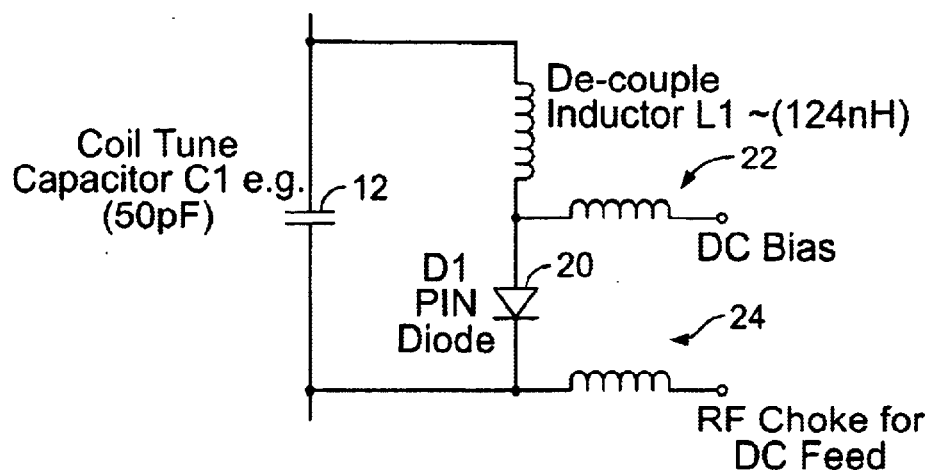
FIG. 2 is a schematic diagram of a prior art active detuning circuit.

As an example, at 64 MHz the tuning capacitor 12 of FIG. 2 has a value of 50 pF and a reactance of 50 Ohms. If the detuning inductor 16 sees 400 Volts during transmit, 8 Amps will flow in the inductor 16. If the value of the capacitor 12 were to be reduced to, for example 35 pF as shown in FIG. 5, it's reactance becomes 71 Ohms and the current is reduced to 5.6 Amps. The overall heat reduction is significant, because for many components in the circuit, the heating effect is proportional to the current squared. When a secondary tuning capacitor 48 is placed across the switch 50, the capacitor 48 is shorted out during transmit and in series with the inductor 16" during receive. The effect of the inductor 16" is to make the capacitor 48 appear larger because some of its negative reactance is cancelled by the inductor 16". The new component values are: L1=71 Ohms/(2*PI*64 MHz)=177 nH. L1 has changed to be resonant with the new value of C1. In receive mode, 15 pF is missing from the tuning capacitor; 15 pF has a reactance of 167 Ohms at 64 MHz. This reactance is made up of the reactances of C3 and L1. The reactance C3=167+71=238 Ohms. C3=1/(238 Ohms*2*PI*64 MHz)=10.5 pF. This technique has a small drawback; the losses in L1 reduce the Q factor of C3. If we assume a good quality inductor is used with a Q of 140, the series loss will be 71 Ohms/140~0.5 Ohms. Assuming all the capacitors are perfect, the Q factor of the C3-L1 combination is 167/0.5=334. This capacitor is only a part of the total tuning capacitance and the Q factor of C1-L1-C3 combination will be parallel loss equivalent of L1-C3 divided by 50 Ohms: 167 Ohms 0.334/50 Ohms=a Q factor of 1,116.

In a practical 1.5T surface coil the change in unloaded Q factor is measurable but the change to the overall performance of the coil is expected to be very small because the loaded Q factor of the test coil is around 25.

Figure 6:
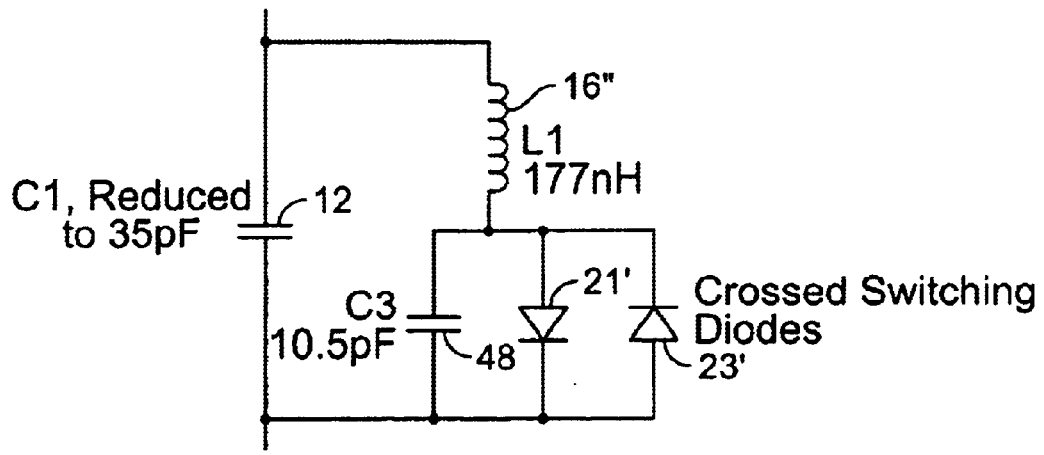
FIG. 6 is a schematic diagram of still another detuning circuit according to the invention.

Referring to FIG. 6, a current-reduced passive detuning circuit is shown, that is, a cross diode configuration is used as to the detuning switch.

Figure 7:
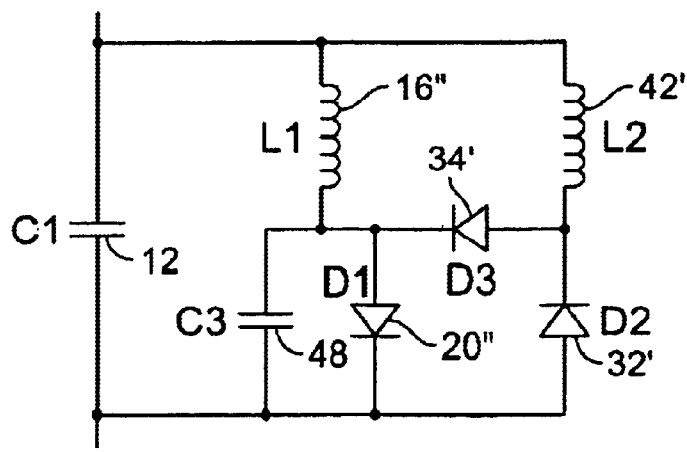
FIG. 7 is a schematic diagram of a further auto-biased detuning circuit according to the invention.

Referring to FIG. 7, an auto-biased PIN diode detuning switch version of the circuit is shown. The version shown uses inductive feed, but the capacitive feed version as discussed above is equally valid.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A detuning circuit for an MRI coil, said MRI coil having a series tuning capacitor, said circuit comprising:
    a detuning inductor and a PIN diode in series and together in parallel communication with said tuning capacitor, said tuning capacitor having a detuning inductor node and a PIN diode node;
    a first diode and a second diode in parallel communication with said PIN diode, said first, second and PIN diodes being arranged with the same serial polarity and said first and second diodes having a common node; and
    a reactance in communication between said common node and said detuning inductor node, said circuit detuning said MRI coil in response to an MRI transmit pulse.

2. A detuning circuit according to claim 1, wherein said reactance is capacitive.

3. A detuning circuit according to claim 1, wherein said reactance is inductive.

4. A detuning circuit according to claim 1, further comprising providing a bias current for said PIN diode.

5. A detuning circuit according to claim 1, wherein said first diode and said second diode comprise switching diodes.

6. A detuning circuit according to claim 1, further comprising a bias capacitor and wherein said common node of said first diode and said second diode is connected to said detuning inductor node through said bias capacitor.

7. A detuning circuit according to claim 1, further comprising a DC blocking capacitor connected in series with said detuning inductor.

8. A detuning circuit according to claim 1, wherein said detuning circuit is configured to operate in connection with an active PIN diode circuit.

9. A detuning circuit for an MRI coil, said MRI coil having a series tuning capacitor, said circuit comprising:
    a detuning inductor; and
    a detuning switch in parallel combination with a secondary tuning capacitor, said detuning inductor and said parallel combination being in parallel communication with said series tuning capacitor, said secondary tuning capacitor acting to reduce current during detuning of said MRI coil.

10. A detuning circuit according to claim 9, wherein said detuning switch includes a crossed diode configuration.

11. A detuning circuit according to claim 9, wherein said detuning switch includes an auto-bias configuration.

12. A detuning circuit according to claim 9, wherein said detuning switch comprises a current-reduced passive detuning circuit.

13. A detuning circuit according to claim 9, wherein said detuning switch comprises an auto-biased PIN diode detuning switch.

14. A method for detuning an MRI coil, said method comprising:
    configuring a detuning inductor and PIN diode in series and together in parallel communication with a tuning capacitor, said tuning capacitor having a detuning inductor node and a PIN diode node;
    configuring a first diode and a second diode in parallel communication with said PIN diode, said first, second and PIN diodes being arranged with the same serial polarity and said first and second diodes having a common node; and
    providing a reactance in communication between said common node and said detuning inductor node.

15. A method according to claim 14, further comprising configuring said reactance to provide capacitive bias.

16. A method according to claim 14, further comprising configuring said reactance to provide inductive bias.

17. A method according to claim 14, further comprising connecting said common node of said first diode and second diode to said detuning inductor through a bias capacitor.

18. A method according to claim 14, further comprising connecting a DC blocking capacitor in series with said detuning inductor.

19. A method according to claim 14, wherein said first diode and second diode comprise switching diodes.

20. A method according to claim 14, further comprising configuring said detuning inductor, PIN diode and first and second diodes to operate in connection with an active PIN diode circuit.

\* \* \* \* \*